(12) United States Patent
Miyauchi

(10) Patent No.: US 6,535,449 B2
(45) Date of Patent: Mar. 18, 2003

(54) SEMICONDUCTOR MEMORY UNIT IN WHICH POWER CONSUMPTION CAN BE RESTRICTED

(75) Inventor: Shigenori Miyauchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,873

(22) Filed: Nov. 13, 2001

(65) Prior Publication Data

US 2002/0181311 A1 Dec. 5, 2002

(30) Foreign Application Priority Data

May 29, 2001 (JP) ........................................ 2001-160269

(51) Int. Cl.$^7$ ................................................. G11C 7/00
(52) U.S. Cl. ........................ 365/227; 365/226; 365/233
(58) Field of Search ................................. 365/227, 226, 365/233, 189.05, 189.09, 185.09

(56) References Cited

U.S. PATENT DOCUMENTS 5,818,781 A * 10/1998 Estakhri et al. ........ 365/189.09

FOREIGN PATENT DOCUMENTS

| JP | 5-282067 | 10/1993 |
|---|---|---|
| JP | 7-287699 | 10/1995 |
| JP | 2000-172383 | 6/2000 |

* cited by examiner

Primary Examiner—David Lam
(74) Attorney, Agent, or Firm—McDermott, Will & Emery

(57) ABSTRACT

A semiconductor memory unit which includes a plurality of nonvolatile memories for storing data and is operable at a plurality of source voltages, comprising: a voltage detector for detecting an input voltage inputted to the semiconductor memory unit from the source voltages; and a central processing unit (CPU) which sets a maximum permissible current consumption value of the semiconductor memory unit on the basis of the input voltage and controls the number of the nonvolatile memories operated at a time such that a current consumption value of the semiconductor memory unit does not exceed the maximum permissible current consumption value.

3 Claims, 5 Drawing Sheets

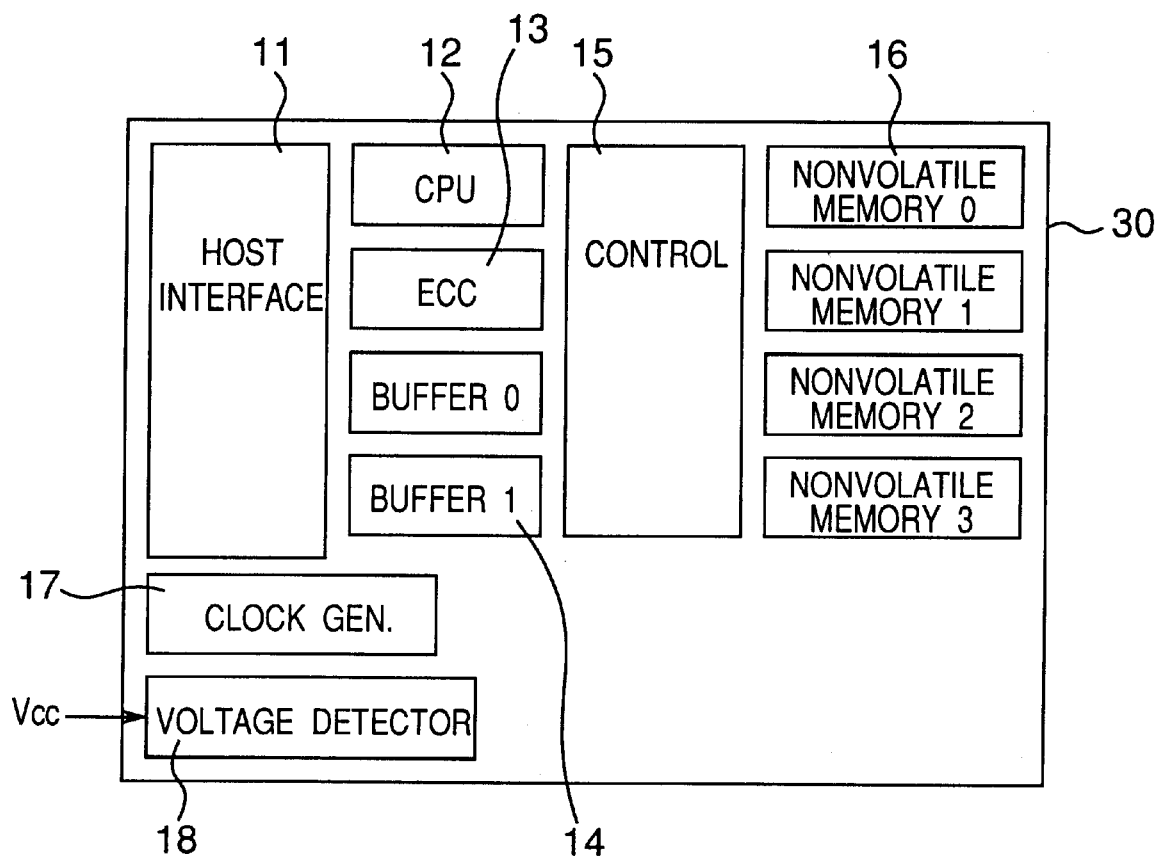

Fig.2

| PROCESSING ON NONVOLATILE MEMORY 0 | PROCESSING ON NONVOLATILE MEMORY 1 | PROCESSING ON NONVOLATILE MEMORY 2 | PROCESSING ON NONVOLATILE MEMORY 3 |
|---|---|---|---|
| HOST→BUFFER 0 | | | |
| BUFFER 0→ECC | HOST→BUFFER 1 | | |
| BUFFER 0→NONVOLATILE MEMORY 0 | BUFFER 1→ECC | | |
| DATA PROGRAM | BUFFER 1→NONVOLATILE MEMORY 1 | WAIT FOR PROCESSING ON NONVOLATILE MEMORY 0 | |
| | DATA PROGRAM | HOST→BUFFER 0 | |
| | | BUFFER 0→ECC | |
| | | BUFFER 0→NONVOLATILE MEMORY 2 | WAIT FOR PROCESSING ON NONVOLATILE MEMORY 1 |
| | | DATA PROGRAM | HOST→BUFFER 1 |
| | | | BUFFER 1→ECC |
| | | | BUFFER 1→NONVOLATILE MEMORY 3 |

TIME →

SEMICONDUCTOR MEMORY UNIT IN WHICH POWER CONSUMPTION CAN BE RESTRICTED

BACKGROUND OF THE INVENTION 1. (Field of the Invention)

The present invention relates to a semiconductor memory unit in which power consumption can be restricted in accordance with an input voltage inputted from a plurality of source voltages.

2. (Description of the Prior Art)

A semiconductor memory unit which is operable at a plurality of source voltages such as 5V and 3.3V is known. Meanwhile, a plurality of upper current consumption thresholds are, respectively, provided for the source voltages. Usually, as the source voltages rise higher, the upper current consumption thresholds are also set higher. This is because low-voltage operation is employed for the purpose of lowering power consumption.

In order to operate the semiconductor memory unit at higher speed, it is considered pertinent to employ a method in which operating frequency of an internal control circuit is raised, a method in which the number of nonvolatile memories accessible at a time are increased for their parallel processing, etc.

FIG. 5 shows a configuration of a conventional semiconductor memory unit 10 which is operable at a plurality of source voltages. The conventional semiconductor memory unit 10 includes a host interface circuit 11 for effecting data input-output from and to a host system, a central processing unit (CPU) 12 for controlling the semiconductor memory unit 10, an error check and correct (ECC) circuit 13 for upgrading reliability of the data at the time of transfer of the data, a plurality of buffers 14 utilized for the data input-output, a control circuit 15 for producing a waveform necessary for the data transfer, a plurality of nonvolatile memories 16 for storing the data and a clock generator 17 for actuating internal circuits of the semiconductor memory unit 10.

In the case of data write, the data is delivered from the host system to the buffer 14 via the host interface circuit 11. Thereafter, the data in the buffer 14 is decoded by the ECC circuit 13 and then, is stored in the nonvolatile memory 16. The CPU 12 transfers the data by using the control circuit 15. Data transfer time is determined by an operating frequency of clocks supplied from the clock generator 17 to the CPU 12, the control circuit 15 and the ECC circuit 13. In case the operating frequency of the clocks is high, processing is performed at high speed but current consumption increases.

In the conventional semiconductor memory unit 10, data transfer rate can be raised by using a plurality of the buffers 14 alternately. FIG. 6 schematically shows processing sequences of data write in the conventional semiconductor memory unit 10. By allocating write data to a plurality of the nonvolatile memories 16, write is performed simultaneously and thus, processing time can be shortened. At this time, as the number of the nonvolatile memories 16 operated at a time increases further, operating current rises higher.

In the conventional semiconductor memory unit 10 shown in FIGS. 5 and 6, such a disadvantage is incurred that since a function of detecting an input voltage inputted to the semiconductor memory unit 10 from a plurality of the source voltages is not provided, a minimum of a plurality of maximum permissible current consumption values corresponding to a plurality of the source voltages, respectively is required to be set at an upper current consumption threshold.

SUMMARY OF THE INVENTION

Accordingly, an essential object of the present invention is to provide, with a view to eliminating the above mentioned drawback of prior art, a semiconductor memory unit which operates at an optimum performance corresponding to an input voltage inputted from a plurality of source voltages.

In order to accomplish this object of the present invention, a semiconductor memory unit which includes a plurality of nonvolatile memories for storing data and is operable at a plurality of source voltages, according to the present invention comprises: a voltage detector for detecting an input voltage inputted to the semiconductor memory unit from the source voltages; and a central processing unit (CPU) which sets a maximum permissible current consumption value of the semiconductor memory unit on the basis of the input voltage and controls the number of the nonvolatile memories operated at a time such that a current consumption value of the semiconductor memory unit does not exceed the maximum permissible current consumption value.

BRIEF DESCRIPTION OF THE DRAWINGS

This object and features of the present invention will become apparent from the following description taken in conjunction with the preferred embodiments thereof with reference to the accompanying drawings in which:

FIG. 1 is a schematic block diagram showing a configuration of a semiconductor memory unit according to a first embodiment of the present invention;

FIG. 2 is a diagram showing processing sequences of data write in the semiconductor memory unit of FIG. 1;

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

FIRST EMBODIMENT

Figure 5:
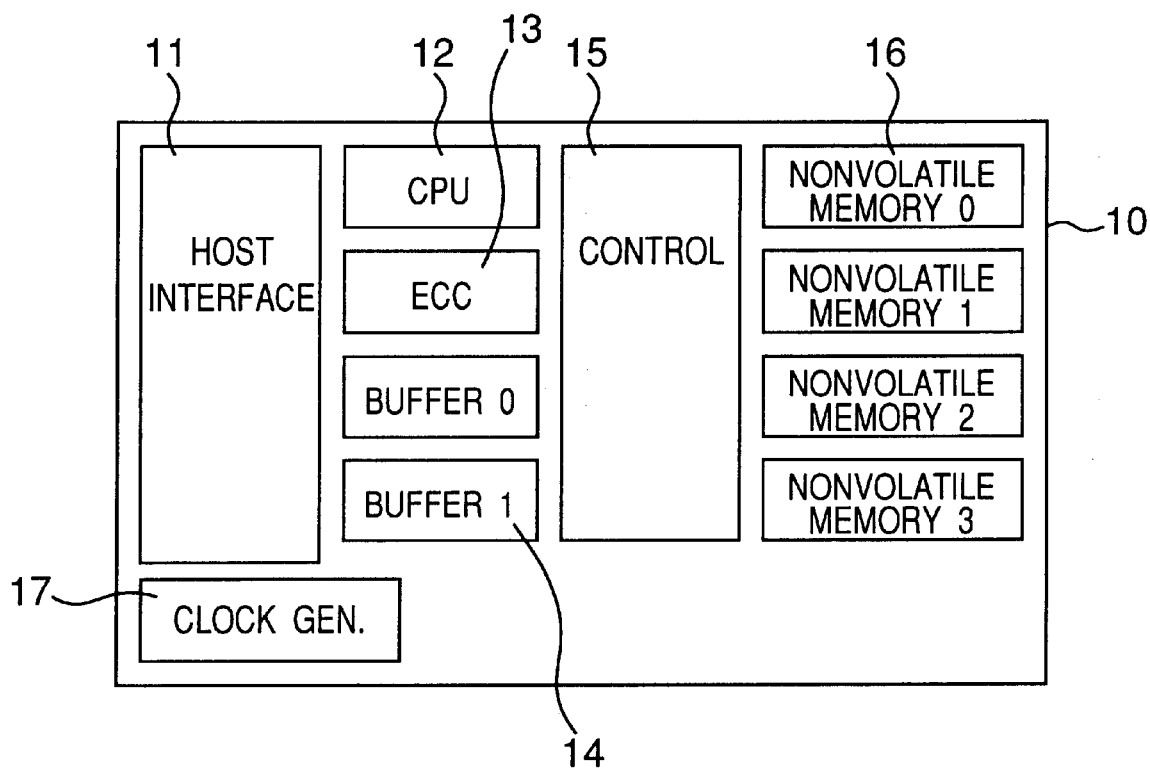
FIG. 5 is a schematic block diagram showing a configuration of a prior art semiconductor memory unit.

FIG. 1 shows a configuration of a semiconductor memory unit 30 according to a first embodiment of the present invention, which is operable at a plurality of source voltages. In the same manner as a conventional semiconductor memory unit 10 shown in FIG. 5, the semiconductor memory unit 30 includes a host interface circuit 11 for effecting data input-output from and to a host system, a central processing unit (CPU) 12 for controlling the semiconductor memory unit 30, an error check and correct (ECC)

circuit 13 for upgrading reliability of the data at the time of transfer of the data, a plurality of buffers 14 utilized for the data input-output, a control circuit 15 for producing a waveform necessary for the data transfer, a plurality of nonvolatile memories 16 for storing the data and a clock generator 17 for actuating internal circuits of the semiconductor memory unit 30.

The semiconductor memory unit 30 further includes a voltage detector 18 for detecting an input voltage inputted to the semiconductor memory unit 30 from a plurality of the source voltages. The CPU 12 is capable of monitoring the input voltage detected by the voltage detector 18.

Figure 6:
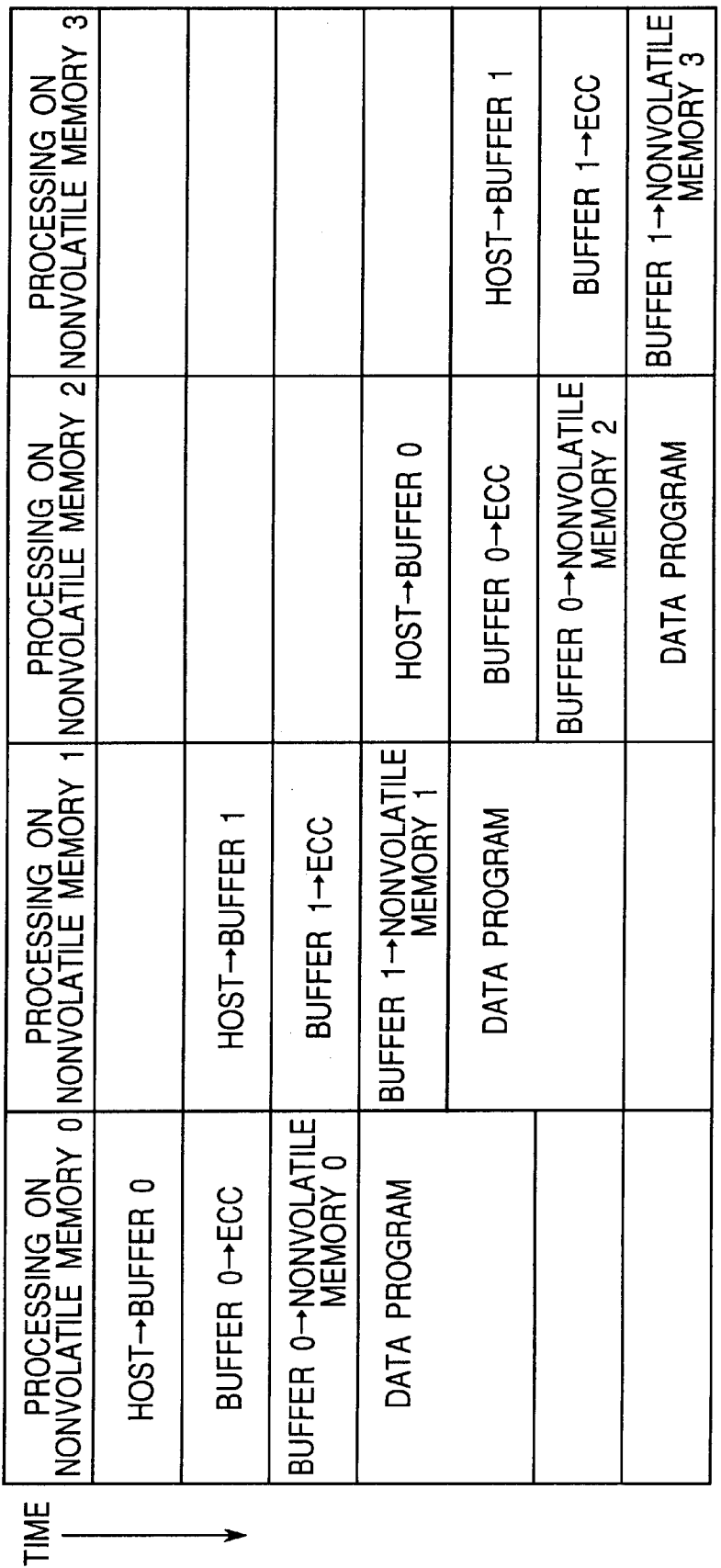
FIG. 6 is a diagram showing processing sequences of data write in the prior art semiconductor memory unit of FIG. 5.

FIG. 2 shows processing sequences of data write in the semiconductor memory unit 30. At the time of the data transfer, the CPU 12 initially sets a maximum permissible current consumption value on the basis of the input voltage detected by the voltage detector 18. In case the maximum permissible current consumption value is large, the data transfer is performed in the same manner as prior art of FIG. 6. On the contrary, in case the maximum permissible current consumption value is small, parallel processing of the nonvolatile memories 16 is performed as shown in FIG. 2 such that a current consumption value does not exceed the maximum permissible current consumption value, so that the current consumption value can be restrained.

In this embodiment, since the number of the nonvolatile memories 16 operated at a time is controlled in accordance with the input voltage such that the current consumption value does not exceed the maximum permissible current consumption value, the semiconductor memory unit 30 is capable of exhibiting an optimum performance within a range of the maximum permissible current consumption value corresponding to the input voltage.

SECOND EMBODIMENT

Figure 3:
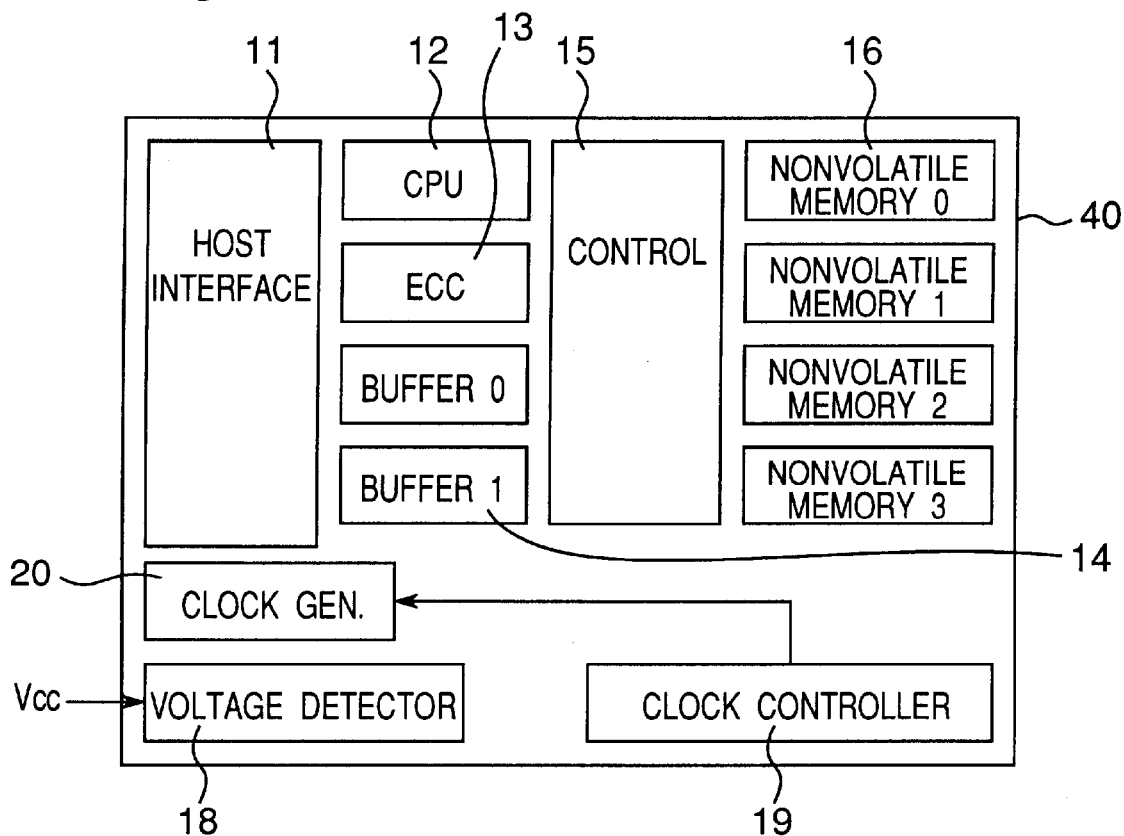
FIG. 3 is a schematic block diagram showing a configuration of a semiconductor memory unit according to a second embodiment of the present invention.
Figure 4:
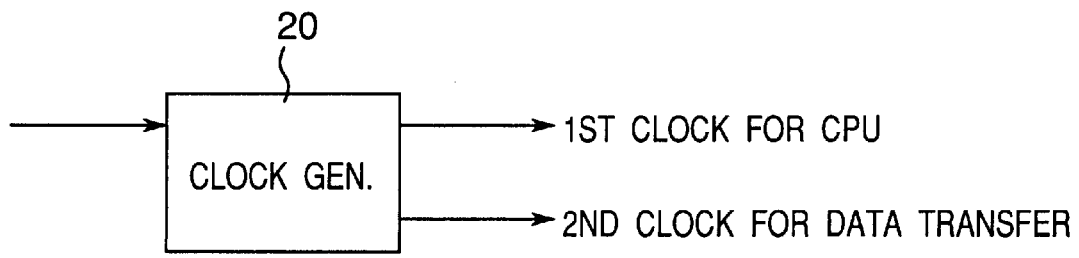
FIG. 4 is a view showing a clock generator employed in the semiconductor memory unit of FIG. 3.

FIG. 3 shows a configuration of a semiconductor memory unit 40 according to a second embodiment of the present invention, which is operable at a plurality of source voltages. The semiconductor memory unit 40 includes a clock generator 20 corresponding to the clock generator 17 of the semiconductor memory unit 30 and a clock controller 19 for controlling the clock generator 20. Since other structures of the semiconductor memory unit 40 are similar to those of the semiconductor memory unit 30, the description is abbreviated for the sake of brevity. As shown in FIG. 4, the clock generator 20 is capable of independently generating a first clock for the CPU 12 and a second clock for data transfer, i.e., for the control circuit 15 and the ECC circuit 13. Meanwhile, the CPU 12 is arranged to independently set operating frequencies of these clocks by using the clock controller 19.

Since the CPU 12 sets a maximum permissible current consumption value on the basis of an input voltage detected by the voltage detector 18 and controls both the number of the nonvolatile memories 16 operated at a time in the first embodiment and the operating frequencies of the clocks such that a current consumption value does not exceed the maximum permissible current consumption value, the current consumption value can be controlled more elaborately than the first embodiment.

In this embodiment, since the number of the nonvolatile memories 16 operated at a time and the operating frequencies of the clocks are controlled elaborately in accordance with the input voltage such that the current consumption value does not exceed the maximum permissible current consumption value, the semiconductor memory unit 40 is capable of exhibiting an optimum performance within a range of the maximum permissible current consumption value corresponding to the input voltage.

As is clear from the foregoing description, such a marked effect can be gained in the semiconductor memory unit of the present invention that the semiconductor memory unit is capable of exhibiting the optimum performance within the range of the maximum permissible current consumption value corresponding to the input voltage.

What is claimed is:

1. A semiconductor memory unit which includes a plurality of nonvolatile memories for storing data and is operable at a plurality of source voltages, comprising:

a voltage detector for detecting an input voltage inputted to the semiconductor memory unit from the source voltages; and a central processing unit (CPU) which sets a maximum permissible current consumption value of the semiconductor memory unit on the basis of the input voltage and controls the number of the nonvolatile memories operated at a time such that a current consumption value of the semiconductor memory unit does not exceed the maximum permissible current consumption value.

2. The semiconductor memory unit according to claim 1, further comprising:

a clock generator which is capable of generating a plurality of internal clocks; and a clock controller for controlling the clock generator;

wherein the CPU controls respective operating frequencies of the internal clocks independently by using the clock controller such that the current consumption value of the semiconductor memory unit does not exceed the maximum permissible current consumption value.

3. The semiconductor memory unit according to claim 2, wherein the internal clocks include a first clock for the CPU and a second clock for transfer of the data.

* * * * *